United States Patent
Arft et al.

(10) Patent No.: US 11,374,535 B2
(45) Date of Patent: Jun. 28, 2022

(54) OVENIZED MEMS

(71) Applicant: SiTime Corporation, Santa Clara, CA (US)

(72) Inventors: Carl Arft, Ann Arbor, MI (US); Aaron Partridge, Cupertino, CA (US); Markus Lutz, Mountain View, CA (US); Charles I. Grosjean, Los Gatos, CA (US)

(73) Assignee: SiTime Corporation, Sunnyvale, CA (US)

( * ) Notice: Subject to any disclaimer, the term of this patent is extended or adjusted under 35 U.S.C. 154(b) by 369 days.

(21) Appl. No.: 16/699,270

(22) Filed: Nov. 29, 2019

(65) Prior Publication Data
US 2020/0186084 A1    Jun. 11, 2020

Related U.S. Application Data

(60) Provisional application No. 62/776,417, filed on Dec. 6, 2018.

(51) Int. Cl.
*H03B 5/04* (2006.01)
*H03B 5/30* (2006.01)
(Continued)

(52) U.S. Cl.
CPC ............ *H03B 5/04* (2013.01); *B81B 3/0081* (2013.01); *H01L 23/3121* (2013.01);
(Continued)

(58) Field of Classification Search
CPC ... H03B 5/30; H03B 5/04; H03B 5/32; H03B 1/02; H03B 5/36; H03H 9/02448;
(Continued)

(56) References Cited

U.S. PATENT DOCUMENTS 9,705,470 B1   7/2017 Doll
9,712,128 B2   7/2017 Doll
(Continued)

FOREIGN PATENT DOCUMENTS

WO   2016205770 A1   12/2016

OTHER PUBLICATIONS

Liu, Chang-Shun, Roozbeh Tabrizian, and Farrokh Ayazi. "A±0.3 ppm oven-controlled MEMS oscillator using structural resistance-based temperature sensing." IEEE transactions on ultrasonics, ferroelectrics, and frequency control 65.8 Jun. 4, 2018: 1492-1499. (Year: 2018).*

Primary Examiner — Ryan Johnson

(57) ABSTRACT

One or more heating elements are provided to heat a MEMS component (such as a resonator) to a temperature higher than an ambient temperature range in which the MEMS component is intended to operate—in effect, heating the MEMS component and optionally related circuitry to a steady-state "oven" temperature above that which would occur naturally during component operation and thereby avoiding temperature-dependent performance variance/instability (frequency, voltage, propagation delay, etc.). In a number of embodiments, an IC package is implemented with distinct temperature-isolated and temperature-interfaced regions, the former bearing or housing the MEMS component and subject to heating (i.e., to oven temperature) by the one or more heating elements while the latter is provided with (e.g., disposed adjacent) one or more heat dissipation paths to discharge heat generated by transistor circuitry (i.e., expel heat from the integrated circuit package).

29 Claims, 5 Drawing Sheets

(51) Int. Cl.
*H01L 23/31* (2006.01)
*H01L 23/34* (2006.01)
*B81B 3/00* (2006.01)
*H01L 23/00* (2006.01)

(52) U.S. Cl.
CPC ............ *H01L 23/345* (2013.01); *H01L 24/16* (2013.01); *H03B 5/30* (2013.01); *B81B 2207/012* (2013.01); *B81B 2207/098* (2013.01); *H01L 2224/16145* (2013.01); *H01L 2924/1461* (2013.01)

(58) Field of Classification Search
CPC .... H03H 9/08; H03H 9/02102; H03H 9/2405; H03L 1/04; H03L 1/028; H01L 2924/1461; H01L 23/345; B81B 2207/012; B81B 7/0096; B81C 1/0023
See application file for complete search history.

(56) References Cited

U.S. PATENT DOCUMENTS

| | | | |
|---|---|---|---|
| 10,218,333 B2 | 2/2019 | Doll | |
| 10,263,596 B2 | 4/2019 | Doll | |
| 10,892,733 B2 | 1/2021 | Doll | |
| 11,228,298 B2 | 1/2022 | Doll | |
| 2005/0151592 A1* | 7/2005 | Partridge | H03L 1/04 331/16 |
| 2013/0264610 A1* | 10/2013 | Chen | H01L 23/345 257/467 |
| 2018/0019754 A1* | 1/2018 | Kaajakari | H03L 1/028 |

\* cited by examiner

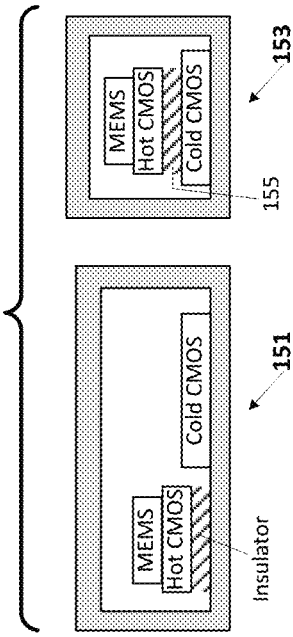
FIG. 3 OCXO MEMS (Split CMOS)
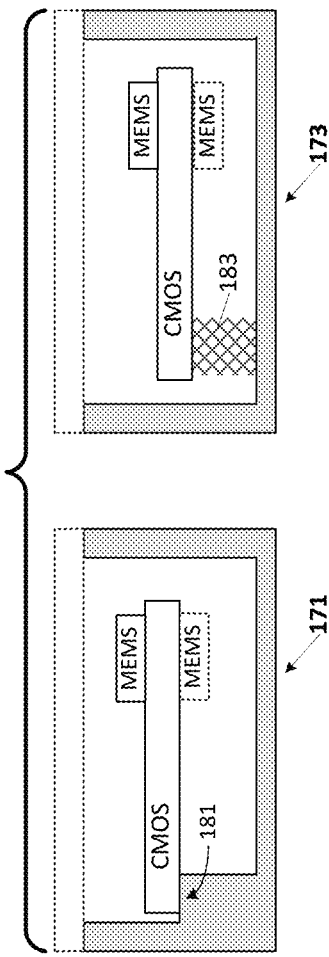
FIG. 4 OCXO with cantilevered/suspended MEMS mount

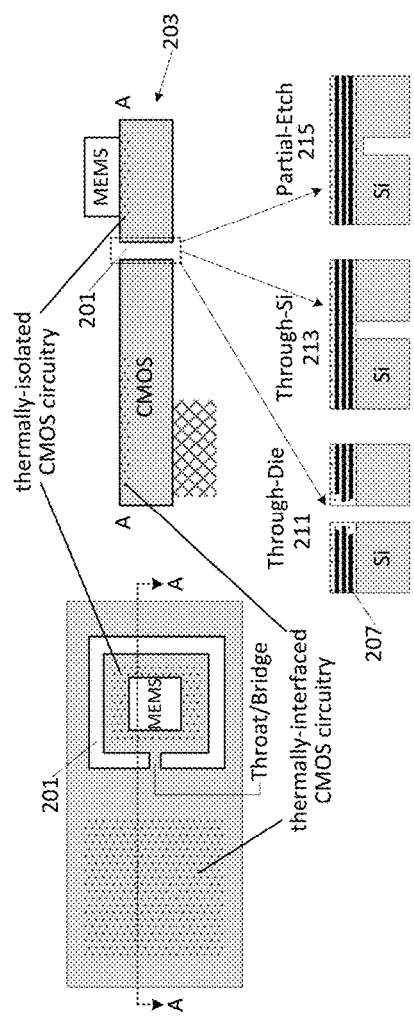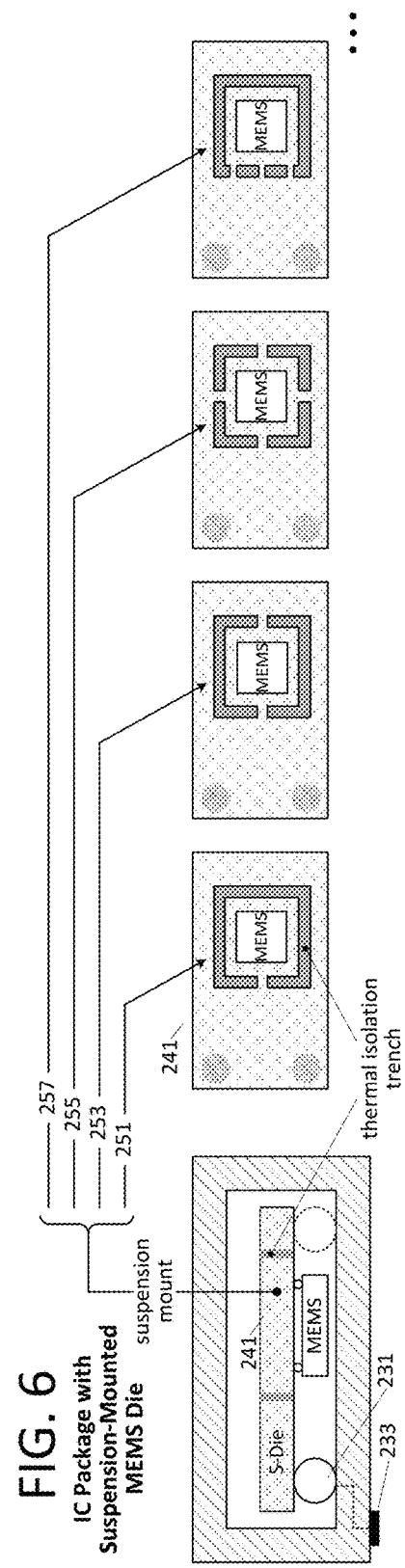

OVENIZED MEMS

CROSS-REFERENCES/TECHNICAL FIELD

This disclosure claims the benefit of U.S. Provisional Patent Application No. 62/776,417, filed on Dec. 6, 2018 on behalf of first-named inventor Carl Arft for "Ovenized MEMS;" the aforementioned patent application is hereby incorporated by reference.

This disclosure relates to an integrated circuit package that encloses one or more microelectromechanical systems (MEMS) components within a temperature-controlled chamber.

DRAWINGS

The various embodiments disclosed herein are illustrated by way of example, and not by way of limitation, in the figures of the accompanying drawings and in which like reference numerals refer to similar elements and in which:

FIG. 3 illustrates a third class of oven-controlled MEMS embodiments, splitting circuitry between integrated-circuit dies operated in respective heated and ambient temperature domains;

FIG. 4 illustrates a pair of oven-controlled MEMS embodiments in which a MEMS die is suspended within a package enclosure by a cantilevered or bridge-configured mounting substrate;

FIG. 5 illustrates a more detailed embodiment of a MEMS/CMOS die pair configured for suspension mounting as shown in FIG. 4;

FIG. 6 illustrates a more detailed embodiment of an oven-controlled MEMS package containing a suspension-mount CMOS die and MEMS die mounted thereto;

DETAILED DESCRIPTION

In various embodiments disclosed herein, microelectromechanical systems (MEMS) components and transistor circuitry are co-located within temperature-stabilized integrated circuit (IC) packages referred to herein as oven-controlled MEMS. In a general implementation, one or more heating elements, fabricated separately from or as part of the transistor circuitry or part of the MEMS die, are provided to heat the MEMS component to a temperature higher than an ambient temperature range in which the IC package is intended to operate—in effect, heating the MEMS component and optionally the related circuitry to a steady-state "oven" temperature above that which would occur naturally during component operation and thereby avoiding temperature-dependent performance variance/instability (frequency, voltage, propagation delay, etc.). In a number of embodiments, the IC package is implemented with distinct temperature-isolated and temperature-interfaced regions, the former bearing or housing the MEMS component and subject to heating (i.e., to oven temperature) by the one or more heating elements while the latter is provided with (e.g., disposed adjacent) one or more heat dissipation paths to discharge heat generated by transistor circuitry (i.e., expel heat from the integrated circuit package).

Figure 1:
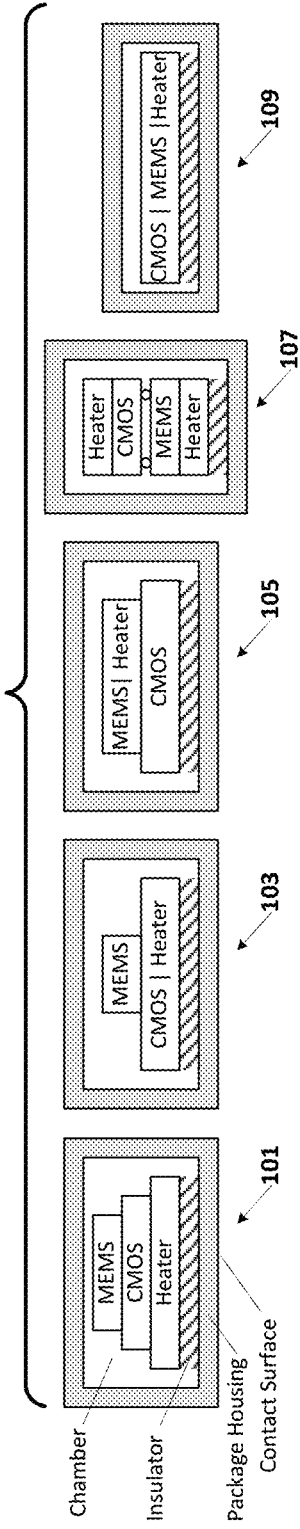
FIG. 1 illustrates various embodiments of oven-controlled MEMS assemblies/packages.

FIG. 1 illustrates various embodiments of oven-controlled MEMS assemblies/packages each having a MEMS component, complementary metal-oxide-semiconductor (CMOS) circuitry and heating element disposed in a stack of one or more semiconductor dies within a package enclosure. In the three-die embodiment shown at 101, for example, a MEMS die, CMOS die and heater die are disposed in a stack (CMOS sandwiched between MEMS and heater in the example shown—MEMS or heater may be the center die and any of the dies may be on the bottom instead of the heater die) and mounted to an interior wall of the package enclosure via a thermally insulating adhesive. Though not specifically shown, the MEMS die includes an interior chamber (e.g., vacuum chamber, or filled with air or inert gas) in which a moveable micromachined element (the "MEMS element") is free to move. In a number of more specific oven-controlled MEMS packages discussed below, the MEMS element is a resonator element (or multiple resonator elements), though additional or alternative types of MEMS elements may be deployed in all cases, with corresponding change in support circuitry (e.g., MEMS thermistor, flex-mounted inertial mass, optical element, additional resonator, etc.). The CMOS die may include a broad variety transistor-based circuits, including temperature-sensitive circuitry intended for operation at the oven-controlled temperature (e.g., temperature detection circuitry, resonator sense/sustain circuitry to effect resonant motion of a MEMS resonator and sense that motion) and also temperature insensitive circuits such as digital circuitry of various types, locked-loops, output drivers, clock dividers and so forth. As discussed below, the temperature-sensitive and insensitive circuits are physically segregated in a number of embodiments, with the former being disposed within a temperature-isolated region subject to heating by the heater element and the latter (temperature-insensitive) circuits disposed in proximity to heat dissipation path(s) to facilitate heat expulsion.

Still referring to FIG. 1, the CMOS circuitry and heater element may be implemented within the same die as shown at 103 (indeed, the heater element may include one or more MOS transistor elements either as control elements and/or heat-generation components), and the heater element and MEMS maybe implemented within the same die as shown at 105. In either of those dual-die stacks, the locations of the two dies relative to the insulative mount may be reversed (i.e., die shown on top may be disposed at bottom of stack). In embodiment 107, CMOS and MEMS dies are disposed between respective heater dies, with one of the heater dies or the other (or both) mounted to the interior package surface via a thermal insulator. In single-die embodiment 109, CMOS circuitry, MEMS element(s) and heater elements are collocated on a single die and mounted to the interior package surface via a thermal insulator.

In general the dies in a multi-die stack (two or more dies) may be stacked in any order (e.g., heater between MEMS die and CMOS die in three-die stack, MEMS die at bottom of stack mounted to thermal insulator) and the die stack may have any orientation with respect to the package housing. Also, in all instances herein, the "heater die" may alternatively be implemented in whole or part by discrete structures or assemblies (e.g., heating coils or other heating elements, discrete circuit components, etc.) rather than circuit elements formed within an integrated circuit die. Whether integrated or discrete, heater elements may be powered and/or controlled by circuitry within the CMOS die or an off-package (external) source. In a number of embodiments, for example, a feedback loop implemented by a temperature sensor disposed in the oven-temperature environment, a heat-controller and the heater element(s)—the heat controller coupled to receive a temperature signal from the temperature sensor and to output a heater-enable signal to the heater element (powering the heater element directly or indirectly) as necessary to counteract an error between sensed temperature and target temperature (e.g., a proportional/integral/derivative or "PID" heat controller).

While transistor circuitry within the various CMOS dies depicted in FIG. 1 and other drawing figures discussed below is generally referred to herein as complementary MOS (CMOS) circuitry, functional circuits or circuit elements on a given die may be implemented purely by N-type MOS circuits or purely by P-type MOS circuits, or in whole or part by any other practicable transistor technology (e.g., bipolar-junction technology, hybrid bipolar/MOS technology such as BiCMOS, various MOS-alternative field-effect technologies, etc.) implemented in various types of substrates (e.g., single-crystal silicon or other semiconductor substrate, silicon-on-insulator (SOI), etc.). Also, though not specifically shown in FIG. 1 or other drawing figures discussed below, electrical interconnects between the MEMS, CMOS and/or heater dies—and between any of those dies and electrical contacts exposed at the surface of the IC package (e.g., at contact surface and/or other surface of the IC package)—may be implemented by any practicable interconnect technology (wire-bonding, conductive vias, microballs, bumps or other conductive projections, etc.) and may include various combinations of different interconnect types. Depiction of specific classes or types of interconnects in FIG. 1 (e.g., micro-balls as shown between MEMS and CMOS dies in embodiment 107) are for purposes of example only. In all embodiments described and depicted herein, alternative/additional electrical interconnects of any practicable type may be employed. Further, the cavity or chamber enclosed by package housing (shaded cross-section) shown in the various embodiments of FIG. 1 and drawing figures below may be filled with air, inert gas or other thermally isolating material (e.g., material used to form insulating die-mount may entirely or at least more completely fill the chamber) or may be evacuated to form a vacuum cavity.

Figure 2:
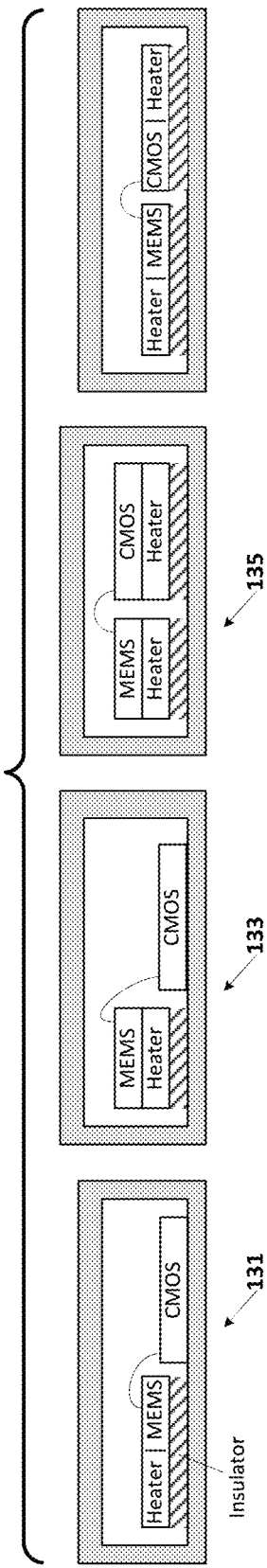
FIG. 2 illustrates various multi-stack (lateral die) oven-controlled MEMS embodiments—alternatives to the single-stack packages shown in FIG. 1.

FIG. 2 illustrates various multi-stack (lateral die) oven-controlled MEMS embodiments—alternatives to the single-stack packages shown in FIG. 1. In the embodiment at 131, a MEMS element and heater circuitry are integrated within a first die and mounted to an interior wall of package housing via a layer of thermally insulating material. A CMOS die is disposed side-by-side (laterally) with respect to the heater/MEMS die with contacts between the laterally disposed dies effected by wire bonds, flex-cable, conductive traces extending within or along a surface of the package housing, etc. In the embodiment at 133, the MEMS and heater elements are disposed in a die stack (the order may be reversed) and insulator-mounted to the interior wall of the package housing. Wire bonds or any other practicable electrical interconnects may interface electrical contacts of the CMOS die with counterpart contacts of the MEMS die and heater die. The multi-stack embodiment at 135 is similar to that at 133, but with an additional heater die disposed in a stack with the CMOS die (stack order may be reversed) with that second stack mounted within the package enclosure via a thermal insulator (e.g., layer of thermally insulating adhesive). Though two discrete insulating-mounts are shown in embodiment 135, a single continuous insulating layer may underly both die stacks). Embodiment 137 is similar to that at 133, but with integration of heating circuitry/elements within the CMOS die and insulated-mounting of the CMOS die within the package enclosure.

FIG. 3 illustrates a third class of oven-controlled MEMS embodiments, in this case splitting CMOS circuitry between heated ("hot") and ambient ("cold") dies—heated CMOS die at oven temperature, ambient CMOS die purposefully cooled (e.g., via heat sinking) to below oven-temperature—in accordance with their temperature dependency/sensitivity characteristics. For example, temperature sensing circuitry that forms part of the oven-temperature feedback loop, temperature-dependent sense/sustain circuitry and any other circuitry that may yield improved system operation at oven temperature (e.g., in terms of temperature stability, measurement accuracy, etc.) are implemented in the heated CMOS die together with heating circuitry or heating elements (heating circuitry may also be disposed in a discrete die within the MEMS/hot-CMOS die stack). By contrast, circuitry generally insensitive to temperature variation or that otherwise does not substantially benefit from operation at fixed oven temperature (especially circuitry that generates substantial heat on its own) is implemented within the ambient CMOS die. In the embodiment at 151, the heated CMOS die is stacked with the MEMS die (i.e., such that the heated CMOS die and MEMS element are both heated to oven temperature) and mounted within the package enclosure via a thermal insulator, while the ambient CMOS die is mounted directly to the package housing for improved heat conduction away from the ambient CMOS die. Though not specifically shown, thermally conductive adhesive and/or mounting structures may be interposed between the ambient CMOS die and interior wall of the housing enclosure to improve thermal conduction/heat expulsion—heat conducting structures may also be implemented within the package housing or otherwise adjacent the ambient CMOS die.

In the FIG. 3 embodiment at 153, separate hot and ambient CMOS dies are separated by a thermally-insulating interposer 155 within a unified (single) die stack. In the specific example shown, the MEMS die is disposed atop the stack (the MEMS die and heated CMOS die may be transposed) and the heated CMOS die includes integrated heating circuitry and/or heating components. In alternative embodiments, a discrete heater die may be provided and disposed within the die stack; between the heated CMOS die and MEMS die, for example, or atop the thermal insulator (beneath the heated CMOS die and MEMS die) or at the top the die stack.

FIG. 4 illustrates a pair of oven-controlled MEMS embodiments 171, 173 in which a MEMS die is suspended within a package enclosure by a cantilevered or bridge-configured mounting substrate—implemented in the depicted embodiments by a CMOS die. In the cantilevered approach shown at 171, the CMOS die is affixed at one end to a die-mount surface 181 formed integrally with or otherwise abutting a side-wall of the package housing. In the approach at 173, by contrast, the CMOS die is cantilever mounted to a stand-alone die-mount structure 183. In either embodiment, the CMOS die may additionally be supported at one or more additional peripheral surfaces (i.e., the CMOS die forms a bridge, traverse, etc. that spans a void or chamber) in which case, the MEMS die may be substantially centered between CMOS mounting points. In all such embodiments, the MEMS die may be disposed in a region of the CMOS die containing circuitry intended for operation at oven temperature and, as discussed below, one or more through-die or partial-cut trenches may be implemented within the CMOS die to thermally isolate the MEMS die and "hot" CMOS circuitry. Also, as shown by the dashed-outline under-mount, the MEMS die may be disposed either on a top or bottom surface of the CMOS die. Ambient CMOS circuitry (i.e., circuitry intended for operation below oven-temperature—e.g., temperature insensitive or requiring/benefiting from heat dissipation) may be implemented in the region of the CMOS die-mount surface (181, 183) together with structures that facilitate heat conduction away from the ambient CMOS circuitry and out of the oven-controlled MEMS packages.

Despite depiction of the suspension-mount substrate as CMOS dies in FIG. 4 and embodiments discussed below, the suspension-mount substrate may be implemented by structures other than CMOS dies in all cases—for example, a blank semiconductor substrate (silicon, germanium, etc.), a silicon or other semiconductor substrate selectively doped to increase thermal isolation and/or thermal conduction in selected die regions), or any other viable monolithic, doped or compound structure (e.g., blank silicon-on-insulator die) suitable for suspending an oven-controlled MEMS die within an integrated-circuit package. In all such embodiments, CMOS circuitry (hot and cold) may be implemented within one or more discrete dies mounted to the suspension substrate and/or disposed elsewhere within the integrated circuit package.

FIG. 5 illustrates a more detailed embodiment of a MEMS/CMOS die pair configured for suspension mounting as shown in FIG. 4. As shown, "thermally-interfaced" CMOS circuitry (i.e., "cold" CMOS circuitry—subject to cooling via one or more heat dissipation strategies) is disposed in a region above the die-mounting surface, while a thermal isolation trench 201 surrounds the MEMS die and thermally isolated ("hot") CMOS circuitry. Referring to the A-A cross-section at 203 and more specifically to the through-die (211), through-silicon (213) and partial-etch (215) implementations of isolation trench 201, the isolation trench or "thermal moat" may be implemented by a through-die etch (in which metal layers 207 may be routed through a throat or bridge of the CMOS die extending between the die-mount region and the thermally isolated region), by a through-semiconductor/through-silicon etch that extends through the single-crystal silicon substrate of the CMOS die but not through the oxide/metal layers atop the die, or by a partial silicon etch that extends only partly through the single-crystal silicon substrate of the CMOS die. In all implementations, the isolation trench or "moat" may also provide isolation from external stresses and/or systemic stresses caused, for example, by thermal expansion mismatches (particularly in the case of materials or components having different coefficients of thermal expansion, CTE).

FIG. 6 illustrates a more detailed embodiment of an oven-controlled MEMS package containing a suspension-mount CMOS die and MEMS die mounted thereto. In the specific example shown, contact balls 231 (or projections or bumps) serve double-duty as the die-mounting surface (i.e., suspending the CMOS die within the package enclosure) and as the electrical interconnect between contacts on the CMOS die and traces extending to exposed package contacts 233. The contact balls (or other electrical interconnect structures) may also serve as heat-dissipation paths with respect to ambient CMOS circuitry (i.e., circuitry disposed adjacent or otherwise proximally to the contact balls) and, though shown at both ends of the CMOS die, may be disposed at fewer than all four peripheral regions of the CMOS die (e.g., only at one edge, two edges or three edges). Still referring to FIG. 6, the thermal isolation trench or moat may be a continuous feature extending around thermally-isolated region 241 (i.e., except for the throat or bridge region shown in FIG. 5) or may be implemented by two or more adjacent trenches, each separated from neighboring trench(es) by silicon bridges. Regardless of trench count/continuity, the trench(es) surround and define the thermal isolation region to which the MEMS die is mounted (with or without heated CMOS circuitry implemented within the isolation region) and thus form a suspension mount within the suspended CMOS die (or other suspended substrate). A number of possible trench patterns are shown at 251, 253, 255 and 257—in call cases, the overall shape of the collective outline of the isolation region may have more or fewer sides (i.e., fewer or more than the quadrilateral shown—including an ellipsoid, circular or otherwise partially or wholly curved pattern), different aspect ratio (i.e., need not be square), and so forth.

Figure 7:
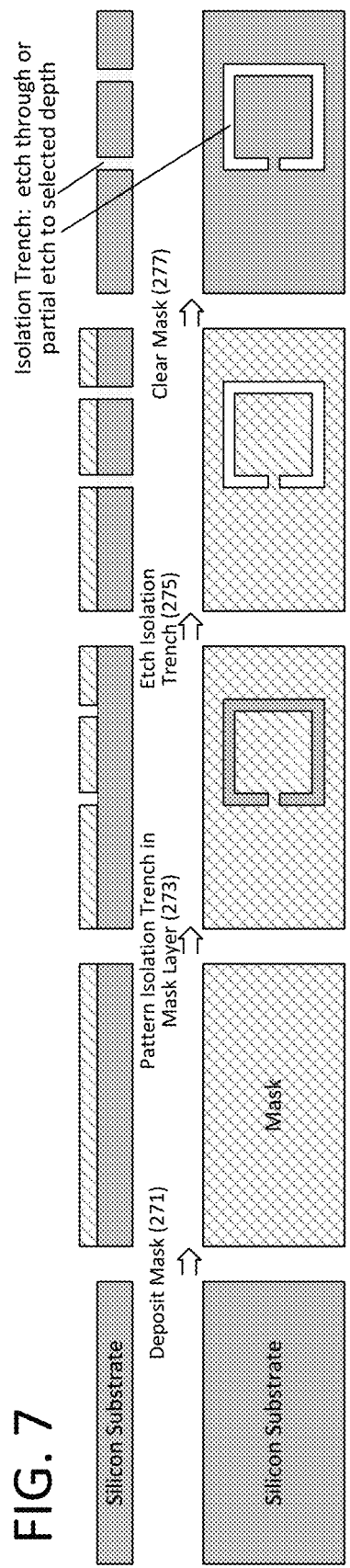
FIG. 7 illustrates an exemplary process for fabricating a through-die thermal isolation trench within a silicon substrate.

FIG. 7 illustrates an exemplary process for fabricating a through-die thermal isolation trench within a silicon substrate (which may have MOS circuitry implemented therein). As shown, a masking layer is deposited on a surface of the silicon substrate at 271, then patterned (etched) at 273 in preparation for isolation trench formation. At 275, the silicon exposed via the patterned masking layer is etched—all the way through in the depicted example, though partial-trenching (i.e., to selected depth less than all the way through the silicon substrate) may be executed instead—to form the isolation trench and thus define the suspension mount for the MEMS die. After trench etching (e.g., via deep reactive ion etching (DRIE) or other silicon etching process), the masking layer is cleared at 277 to yield a silicon substrate with a thermally-isolated suspension mount.

Figure 8:
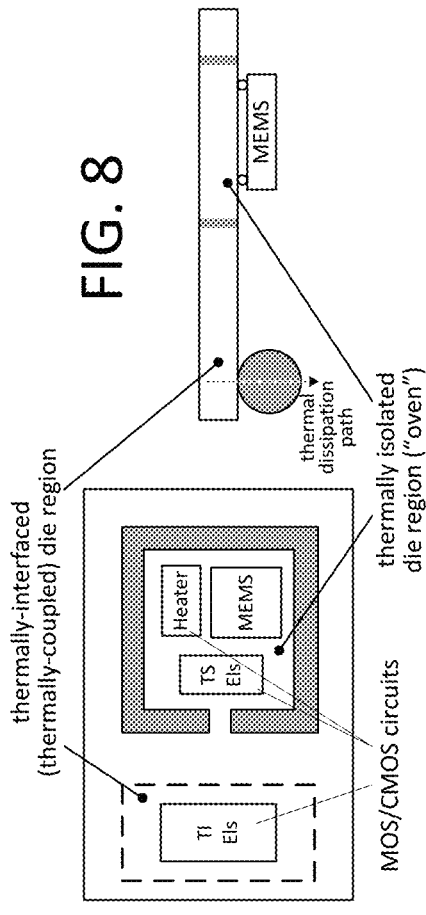
FIG. 8 illustrates an exemplary layout of circuitry, heater element(s) and MEMS die within thermally segregated regions of a substrate.

FIG. 8 illustrates an exemplary layout of circuitry, heater element(s) and MEMS die within thermally segregated regions of a substrate—in this case a CMOS die or other substrate with an etched isolation trench. As shown, thermally-interfaced circuit elements (i.e., "TI EIs" depicted in FIG. 8) are disposed within a thermally-interfaced region of the CMOS die adjacent a thermal dissipation path (e.g., through a ball contact or other electrical interconnect), while thermally-sensitive circuit elements ("TS EIs" as shown in FIG. 8) are disposed together with heater circuitry and a MEMS die within the thermally-isolated die region (i.e., the "oven"). The MEMS die may be under-mounted within the thermal-isolation region as shown, or top-mounted or even omitted altogether in favor of a MEMS element formed integrally within the thermal isolation region of the silicon substrate.

Figure 9:
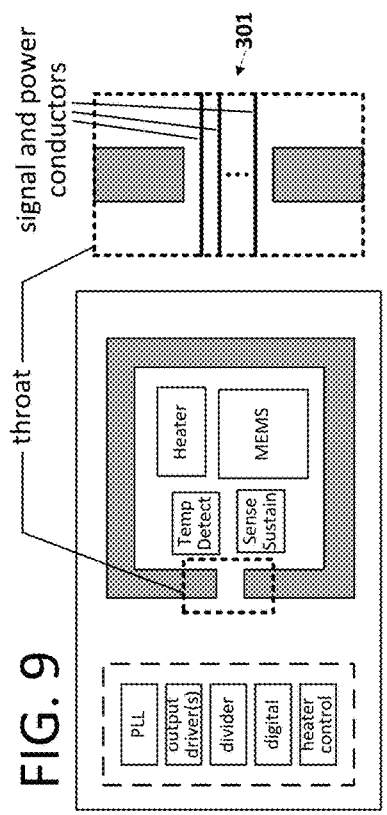
FIG. 9 illustrates additional detail with respect to thermally-interfaced and thermally-isolated circuitry that may be implemented within thermally segregated die regions to implement a MEMS-based oscillator.

FIG. 9 illustrates additional detail with respect to thermally-interfaced and thermally-isolated circuitry that may be implemented within like-named die regions (i.e., as shown in FIG. 8) to implement a MEMS-based oscillator—that is an integrated-circuit package that outputs a timing signal derived from resonant motion of a MEMS resonator disposed within the thermally-isolated region. In the depicted example, the thermally-sensitive circuitry includes a temperature detection (or temperature sensor) circuit and resonator sense/sustain circuitry. The temperature detection circuit is generally disposed in close proximity to the MEMS resonator (i.e., to limit temperature difference or gradient due to temperature lag) and may include one or more components within the MEMS resonator die (or resonator cavity) itself. In a number of embodiments, for example, the temperature detection circuit may include, as a temperature-sensitive element, an additional MEMS resonator (i.e., temperature-sensitive resonator whose resonant frequency changes differently with temperature than another MEMS resonator designed/engineered to be less sensitive to temperature change) or a MEMS thermistor. In other embodiments, the temperature detection circuit may be referenced to a precision resistor, a switched capacitor network, a switched resistor network (e.g., the precision resistor, switched capacitor network and/or switched resistor work forming a precision resistance within a measurement bridge). More generally, any practicable temperature detection circuitry may be implemented in whole or part within the temperature isolation region of the suspension-mount die. Likewise, resonator sense/sustain circuitry may be implemented by any circuitry capable of rendering the MEMS resonator (or resonators if more than one) into mechanically resonant motion and generating an output signal corresponding to that motion. In a number of embodiments, for example, the sense/sustain circuitry is coupled to drive and sense electrodes within the resonator chamber (i.e., electrodes disposed at the periphery of the chamber housing the resonant MEMS structure) to electrostatically induce resonant motion and electrostatically sense the resonant motion. In other embodiments, resonator drive and/or sense may be effected through piezoelectric actuation of the resonator or piezoelectric sensing of resonant motion—generally through application of drive signals to (or reception of sense signals via) a layer of piezoelectric material disposed within the resonant MEMS structure.

Still referring to FIG. 9, the temperature-interfaced (cold) circuitry includes, for example and without requirement or limitation, phase-locked-loop circuitry (PLL) to generate a frequency-multiplied (and/or frequency-pulled) instance of the resonator output signal from sense/sustain circuitry (i.e., sense signal indicative of resonant motion); digital circuitry to perform high-precision temperature correction with respect to the resonator output signal and/or PLL output signal (e.g., based on contemporaneous oven temperature indicated by temperature detection circuitry and, for example, temperature-sensitivity modeling of the MEMS resonator element) or signal filtering or other digital signal processing operations (including temperature-to-digital conversion based on temperature information provided by the temperature detection circuitry); divider circuitry to perform frequency division and thus provide a clock signal at a specified nominal frequency; output driver circuitry to drive the clock signal (and possibly other information, including status, synchronized pulse-output, etc.) to a destination off the CMOS die (e.g., to a contact exposed at periphery of the oven-controlled MEMS package); and heater control circuitry to power the heater as necessary to maintain the oven temperature at a desired target (e.g., a controller that forms a closed loop with respect to the heater and temperature detector). Various other circuitry may be provided, including nonvolatile and/or volatile memory to support device programming (e.g., to store programmed setting of the target oven temperature, permissible oven temperature range or deviation from setpoint, output clock frequency, output pulse rate/duration; to store lookup tables employed for temperature-indexed frequency correction, temperature-to-digital conversion, etc.), circuits to implement delta-sigma modulation (e.g., in the case of a fractional-N instance of the PLL circuit), analog to digital conversion, etc.

Electrical interconnections between temperature-interfaced circuitry and temperature-isolated circuitry may be effected by wired traces implemented within or along a surface of the substrate. In through-die trench embodiments, the trace interconnects may be routed through the throat (or bridge) as shown at 301, or, in cases where trenching is limited to the silicon substrate (i.e., one or more metallization layers intact and continuous), the trace interconnects may be routed relatively freely between the temperature-isolated and temperature-interfaced circuit elements. Also, instead of traces extending over the die surface (and/or within the die), wire-bonds, flex-tape, cable or other conductive structures may be used to electrically interconnect the various circuit elements in different die regions. Moreover, the metal layers (or any subset thereof) can be routed, shaped or otherwise configured to thermally engineer the performance of the carrier die. For example, metal traces or planes can be used to direct the heat flow from the "ambient" die to the package pads, or can be used to thermally couple the heater to the MEMS element.

Figure 12:
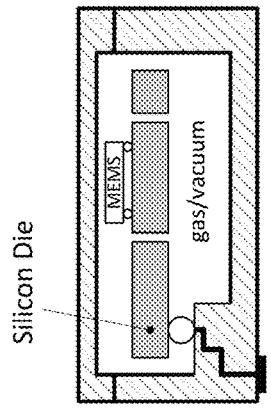
FIGS. 10-12 illustrate exemplary arrangements for supporting the suspension-mount substrate within an oven controlled MEMS package.
Figure 11:
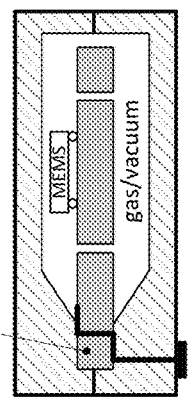
Figure 10:
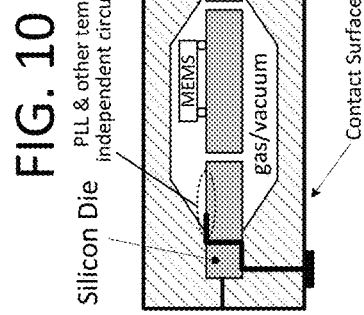

FIGS. 10-12 illustrate exemplary arrangements for supporting the suspension-mount substrate within an oven controlled MEMS package. In the embodiment of FIG. 10, upper and lower (base and lid) components of a package substrate are shaped to receive and secure the periphery of a suspension-mount silicon die (e.g., CMOS die) and also to establish a hermetically sealed chamber that encloses a suspension-mounted MEMS die. A through-die trench may be implemented (as shown) to isolate an oven-region (thermally-isolated region) of the silicon die, or a more shallow trench (through-silicon-etch or partial-etch) may be formed as discussed above, or the isolation trench may be omitted altogether. In any case, the chamber formed by the package base and lid components may be evacuated (forming a vacuum) or filled with an inert gas or air, and may extend to more or less of the suspension-mount die than shown. For example, the socket formed by the package base/lid clamshell may be deep enough to envelop a region of the silicon die adjacent the thermal isolation trench so that the extent of the chamber may be substantially coextensive with the thermally isolated region of the silicon die. The MEMS die may be under-mounted (instead of top-mounted) to the silicon substrate, and CMOS circuitry may be implemented both within and outside the temperature-isolated substrate region as discussed above. In the FIG. 10 embodiment, the CMOS circuitry is disposed on a surface of the silicon die opposite the package contact surface (a single contact and trace/via interconnection to circuitry within the "cold" region of the substrate is depicted—multiple contacts will extend to circuitry in both cold and hot regions of the suspension-mount substrate in actual implementation) but may also/alternatively be implemented on the silicon die surface facing the package contact surface.

FIGS. 11 and 12 illustrate alternative packaging arrangements in which the suspension-mount die is cantilevered (secured to package housing or other mounting surface at fewer than all edges) to reduce thermal conduction between thermally isolated (oven) and thermally interfaced (cold) regions of the suspension-mount die. In FIG. 11, for example, the package lid and base form a receptacle (socket) for securing at least one periphery (one edge) of the suspension-mount die, and, in FIG. 12, the suspension-mount die is secured via soldered interconnect structure (a contact ball in this example) to a die-mount surface (i.e., formed integrally with or as a material deposition/formation on the base component of the package). The various circuitry locations, MEMS die mounting options, chamber-fill options (inert gas, air, vacuum, etc.), chamber extent/dimensions, isolation trenching options, material types (silicon die instead of CMOS, or other type of suspension substrate), etc. discussed above apply equally to the FIGS. 11 and 12 embodiments.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific, interconnect types, material types, circuit implementations, component dimensions (relative or absolute), component elements and the like can be different from those described above in alternative embodiments. Signal paths depicted or described as individual signal lines may instead be implemented by multi-conductor signal buses and vice-versa, and may include multiple conductors per conveyed signal (e.g., differential or pseudo-differential signaling). The term "coupled" is used herein to express a direct connection as well as a connection through one or more intervening functional components or structures. Device configuration or programming can include, for example and without limitation, loading a control value into a register or other storage circuit within an integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

We claim:

1. An integrated circuit comprising:
   a first die having a microelectromechanical system (MEMS) component;
   a heating element to heat the MEMS component; and
   a second die comprising complementary metal oxide semiconductor (CMOS) circuitry, the CMOS circuitry to receive a signal representing operation of the MEMS component and to generate an output dependent thereon;
   wherein the integrated circuit encapsulates at least the first die and the heating element so as to provide a controlled temperature environment for the first die; and
   wherein the integrated circuit comprises a structure disposed between the heating element and the second die to isolate the CMOS circuitry from the controlled temperature environment.

2. The integrated circuit of claim 1 wherein the MEMS component comprises an interior chamber and a vibrating structure that is encapsulated within the interior chamber.

3. The integrated circuit of claim 2 wherein:
   the signal represents a resonant frequency of the vibrating structure;
   the output is an oscillation signal; and
   the second die is to generate the oscillation signal dependent on the resonant frequency.

4. The integrated circuit of claim 3 wherein the CMOS circuitry comprises a locked loop to generate the oscillation signal from the signal representing the resonant frequency.

5. The integrated circuit of claim 2 wherein:
   the integrated circuit further comprises a temperature sensor; and
   the CMOS circuitry is to receive a signal from the temperature sensor representing a temperature experienced by the MEMS component.

6. The integrated circuit of claim 5 wherein the CMOS circuitry is to implement a feedback loop to control the heating element in response to the signal from the temperature sensor, to urge the temperature experienced by the MEMS component toward a predetermined temperature.

7. The integrated circuit of claim 6 wherein the predetermined temperature is greater than an ambient temperature range in which the integrated circuit is intended to operate.

8. The integrated circuit of claim 5 wherein the CMOS circuitry is to adjust a value of a parameter conveyed by the signal representing the operation of the MEMS dependent on the signal from the temperature sensor.

9. The integrated circuit of claim 1 wherein the MEMS component comprises a vibrating structure and wherein the CMOS circuitry comprises circuitry to sustain motion of the vibrating structure.

10. The integrated circuit of claim 1 wherein the second die is encapsulated together with the first die and the heating element, relative to an ambient environment external to the integrated circuit.

11. The integrated circuit of claim 1, wherein the first die is electrically coupled to the second die by at least one wire bond.

12. The integrated circuit of claim 1 wherein the integrated circuit comprises a third die, the third die including the heating element, the first die including a first planar surface, the third die including a second planar surface, the first planar surface being bonded to the second planar surface.

13. The integrated circuit of claim 1 wherein:
    the second die comprises a first region, a second region, and a thermal isolation trench separating the first region and the second region;
    the CMOS circuitry is carried by the first region; and
    the first die is mounted to the second region.

14. The integrated circuit of claim 13 where the first die is mechanically and electrically coupled to the second die in the second region by solder bumps.

15. The integrated circuit of claim 13 wherein the second die is to mount the first die in a manner suspended within a hermetically-sealed chamber of said integrated circuit, the first die being electrically coupled to the second die, and the second die being electrically coupled to a surface of said chamber to as to electrically interface the MEMS component with an electrical output of said integrated circuit.

16. An integrated circuit comprising:
    a package enclosure;

a first die mounted within the package enclosure, the first die having a microelectromechanical system (MEMS) component, the MEMS component comprising a vibrating structure;

a heating element to heat the MEMS component within the package enclosure and circuitry to control the heating element; and a second die comprising complementary metal oxide semiconductor (CMOS) circuitry, the CMOS circuitry to receive a signal representing resonant frequency of the vibrating structure and to generate an output dependent on at least one of the resonant frequency and change of the resonant frequency;

wherein the package enclosure is to encapsulate at least the first die and the heating element so as to provide a controlled temperature environment for the first die; and wherein the integrated circuit comprises a structure disposed between the heating element and the second die to isolate the CMOS circuitry from the controlled temperature environment.

17. The integrated circuit of claim 16 wherein the output is an oscillation signal.

18. The integrated circuit of claim 17 wherein the CMOS circuitry comprises at least one of a locked loop to generate the oscillation signal from the signal representing resonant frequency and sustain circuitry to sustain vibration of the vibrating structure.

19. The integrated circuit of claim 18 wherein:
the integrated circuit further comprises a temperature sensor;
the CMOS circuitry is to receive a signal from the temperature sensor representing a temperature experienced by the MEMS component; and
the CMOS circuitry is to implement a feedback loop to control the heating element in response to the signal from the temperature sensor, to urge the temperature experienced by the MEMS component toward a steady-state temperature.

20. The integrated circuit of claim 19 wherein the steady-state temperature is greater than an ambient temperature range in which the integrated circuit is intended to operate.

21. The integrated circuit of claim 16 wherein the second die is to mount the first die in a manner suspended within a chamber of said integrated circuit, the first die being electrically coupled to the second die and the second die being electrically coupled to a surface of said chamber to as to electrically interface the MEMS component with an electrical output of said integrated circuit.

22. The integrated circuit of claim 16 wherein the integrated circuit comprises a third die, the third die including the heating element, the first die including a first planar surface, the third die including a second planar surface, the first planar surface being bonded to the second planar surface.

23. The integrated circuit of claim 16 wherein:
the second die comprises a first region, a second region, and a thermal isolation trench separating the first region and the second region;
the CMOS circuitry is carried by the first region; and
the first die is mounted to the second region.

24. The integrated circuit of claim 23 where the first die is mechanically and electrically coupled to the second die in the second region by solder bumps.

25. The integrated circuit of claim 23 wherein the second die is to mount the first die in a manner suspended within a hermetically-sealed chamber of said integrated circuit, the first die being electrically coupled to the second die, and the second die being electrically coupled to a surface of said chamber to as to electrically interface the MEMS component with an electrical output of said integrated circuit.

26. An integrated circuit comprising:
a first die having a microelectromechanical system (MEMS) component;
a heating element to heat the MEMS component; and
a second die comprising complementary metal oxide semiconductor (CMOS) circuitry, the CMOS circuitry to receive a signal representing operation of the MEMS component and to generate an output dependent thereon;
wherein the integrated circuit encapsulates at least the first die and the heating element so as to provide a controlled temperature environment for the first die; and
wherein the integrated circuit comprises a third die, the third die including the heating element, the first die including a first planar surface, the third die including a second planar surface, the first planar surface being bonded to the second planar surface.

27. An integrated circuit comprising:
a first die having a microelectromechanical system (MEMS) component;
a heating element to heat the MEMS component; and
a second die comprising complementary metal oxide semiconductor (CMOS) circuitry, the CMOS circuitry to receive a signal representing operation of the MEMS component and to generate an output dependent thereon;
wherein
the integrated circuit encapsulates at least the first die and the heating element so as to provide a controlled temperature environment for the first die,
the second die comprises a first region, a second region, and a thermal isolation trench separating the first region and the second region;
the CMOS circuitry is carried by the first region; and
the first die is mounted to the second region.

28. The integrated circuit of claim 27 where the first die is mechanically and electrically coupled to the second die in the second region by solder bumps.

29. The integrated circuit of claim 27 wherein the second die is to mount the first die in a manner suspended within a hermetically-sealed chamber of said integrated circuit, the first die being electrically coupled to the second die, and the second die being electrically coupled to a surface of said chamber to as to electrically interface the MEMS component with an electrical output of said integrated circuit.

* * * * *